US007365405B2

(12) United States Patent
Potochnik et al.

(10) Patent No.: US 7,365,405 B2
(45) Date of Patent: Apr. 29, 2008

(54) METROLOGY STRUCTURE AND METHODS (76) Inventors: Stephen J. Potochnik, 611 NW. 15th St., Corvallis, OR (US) 97330; Kenneth Faase, 1325 NW. 14th St., Corvallis, OR (US) 97330

( * ) Notice: Subject to any disclaimer, the term of this patent is extended or adjusted under 35 U.S.C. 154(b) by 457 days.

(21) Appl. No.: 10/832,367

(22) Filed: Apr. 27, 2004

(65) Prior Publication Data
US 2005/0236681 A1    Oct. 27, 2005

(51) Int. Cl.
H01L 29/84    (2006.01)
H01L 23/12    (2006.01)

(52) U.S. Cl. ............ 257/419; 257/414; 257/704; 359/291; 216/2

(58) Field of Classification Search ............ 216/2; 257/419, 704; 359/291
See application file for complete search history.

(56) References Cited

U.S. PATENT DOCUMENTS 6,337,027 B1 * 1/2002 Humphrey ............ 216/2
6,557,413 B2 * 5/2003 Nieminen et al. ............ 73/488
6,673,254 B1 * 1/2004 Marshall et al. ............ 216/2
2002/0158039 A1 * 10/2002 Harris et al. ............ 216/2
2003/0155643 A1 * 8/2003 Freidhoff ............ 257/704
2003/0210116 A1 * 11/2003 Lane et al. ............ 335/78
2004/0166606 A1 * 8/2004 Forehand ............ 438/106

OTHER PUBLICATIONS

Texas Instruments, "DLD Chip With 0.7" Diagonal in a HP XB31 Projector, no date provided.

* cited by examiner

Primary Examiner—Shamim Ahmed (57) ABSTRACT

A method of indicating the progress of a sacrificial material removal process, the method, comprising; freeing a portion of a member, the member being disposed in a cage and laterally surrounded by the sacrificial material; and preventing the freed portion of the member from floating away by retaining the freed member.

20 Claims, 7 Drawing Sheets

METROLOGY STRUCTURE AND METHODS

BACKGROUND

Sacrificial materials are often used in the fabrication of devices, such as MEMS (microelectromechanical system) devices. These sacrificial materials are removed in a later stage in a process flow to generate designed empty spaces below or around the devices. This removal process is also commonly called a release process, because the movable parts of a device are released and free to move in at least one dimension after the sacrificial material is removed. The sacrificial material is often removed using chemical processes, such as etching, near the end of wafer fabrication. Since the sacrificial material often occupies space underneath the movable devices, it is frequently difficult to determine when the removal process is complete using standard optical inspection of the wafer.

In the past, it has been difficult to accurately monitor or evaluate the completeness of the release process. In some processes, device structures are scratched or otherwise physically removed to reveal the progress of the release process.

DETAILED DESCRIPTION OF THE EMBODIMENTS

FIGS. 1, 2, 3, 4, 5, 6, 7, and 8 are provided for illustration purposes only and are not intended to limit the present invention; one skilled in the art would recognize various modifications and alternatives, all of which are considered to be a part of the present invention.

Figure 1:
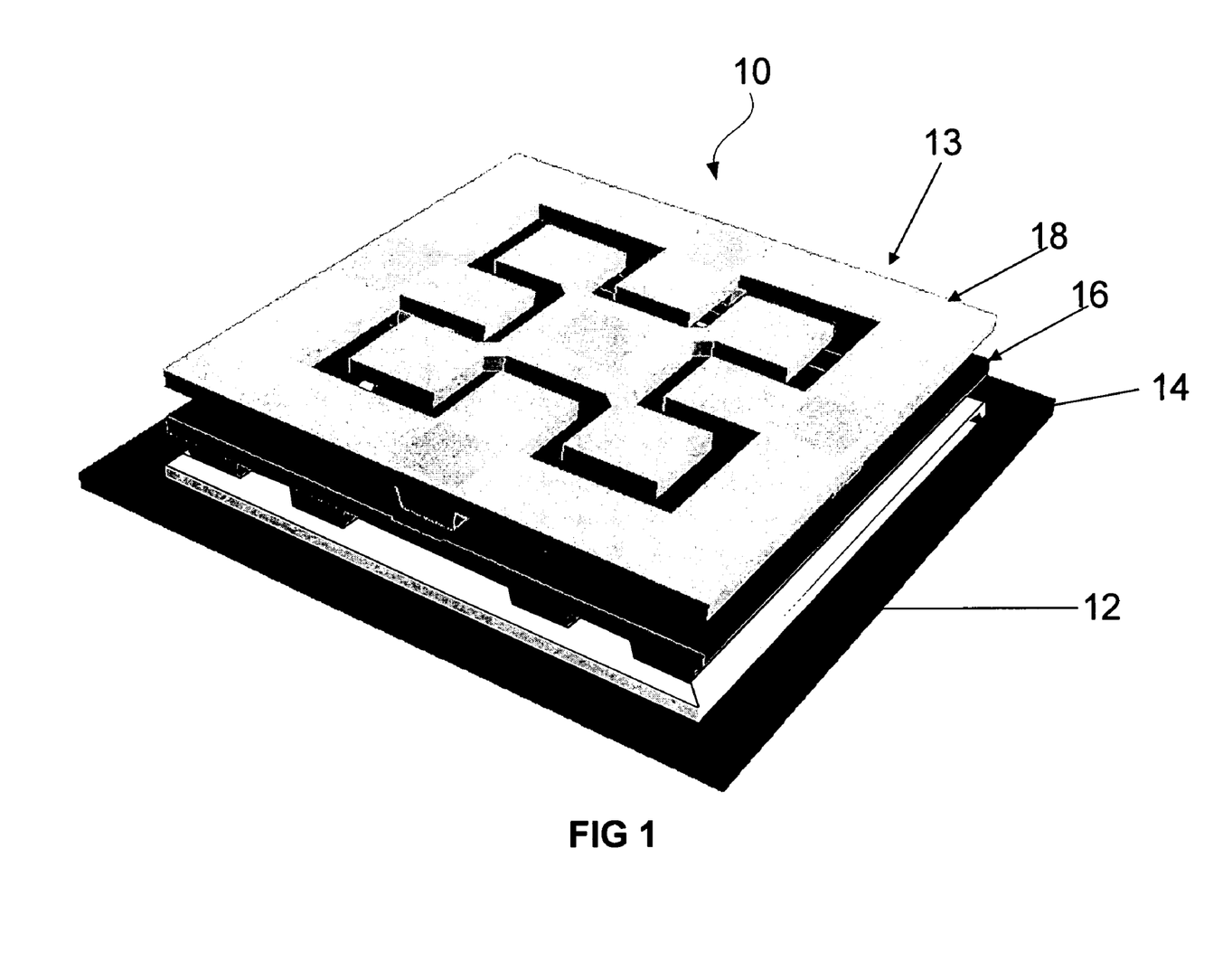
FIG. 1 is an isometric diagram illustrating a metrology structure according to one embodiment of the present invention.

Referring to FIG. 1, one embodiment of a metrology structure 10 is shown. In the embodiment, the metrology structure 10 is disposed on a substrate 12. In some embodiments a MEMS device may be formed on the substrate 12. The metrology structure 10 comprises a cage 13 having sacrificial material (not shown) disposed therein. The cage 13 comprises a first layer 14, a second layer 16, and a third layer 18, disposed successively on the substrate 12. However, the number of layers are not limiting on the invention, and any other suitable number of layers can also be used. Typically, the substrate 12 comprises real MEMS devices (not shown) along with the metrology structure 10. For the purposes of illustration, FIG. 1 comprises only the metrology structure 10. For example, the metrology structure 10 may cover an area of approximately 1% on the substrate 12, with the real MEMS device covering approximately 99% on the substrate 12. These percentages may, of course, vary. In one embodiment, the substrate 12 used can be a silicon wafer or glass, for example. When the fabrication of the MEMS device is finished, the metrology structure 10 can be left on the substrate 12 or diced away during a chip dicing process.

Figure 2:
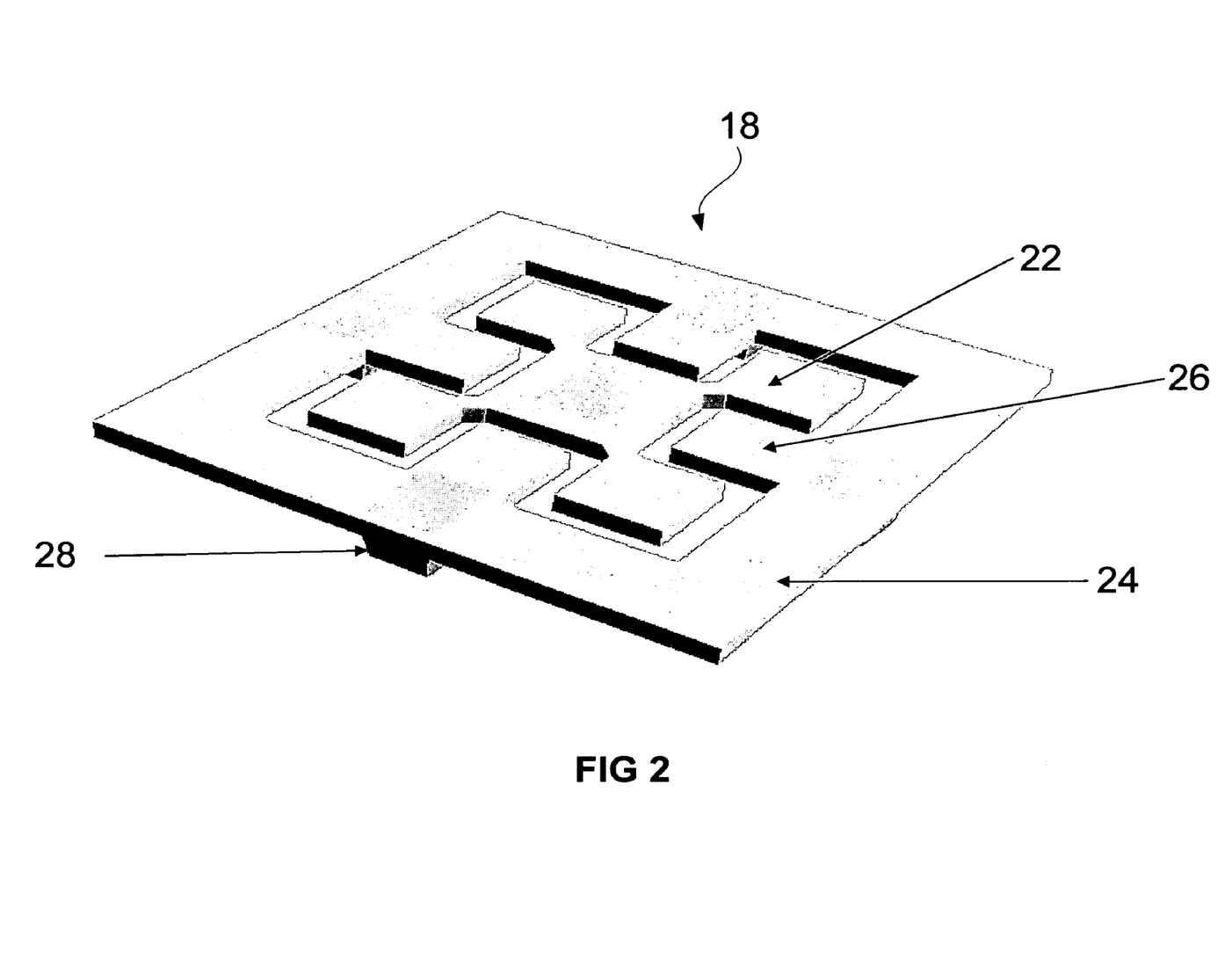
FIG. 2 shows a third layer of a cage according to one embodiment of the present invention.

Referring to FIG. 2, in one embodiment, the third layer 18 of the metrology structure 10 comprises a third portion 22 of a member disposed in a third portion 24 of the cage 13. In one embodiment, the third portion 22 of the member comprises a post 23 (shown in FIGS. 5 and 6) and the third portion 24 of the cage 13 comprises structures such as tabs 26 and posts 28. According to one embodiment, the third portion 24 of the cage of the layer 18 comprises four tabs 26 and four posts 28. During the fabrication of the metrology structure 10, prior to the deposition of the third layer 18, a sacrificial material (not shown) is patterned with holes (corresponding to the post 23 and the posts 28) in such a way that when the third layer 18 is deposited, the post 23 and the posts 28 are formed. The post 23 and the posts 28 act as support columns and are used to provide structural support for the third layer 18. In some example embodiments, of the metrology structure 10, the height dimension for the post 23 and the posts 28 can be in the range of approximately 0.1 μm to 5 μm. According to one embodiment of the present invention, the height dimension for the post 23 and the posts 28 can be in the range of approximately 1 nm to 100 nm. This height dimension may vary.

Figure 3:
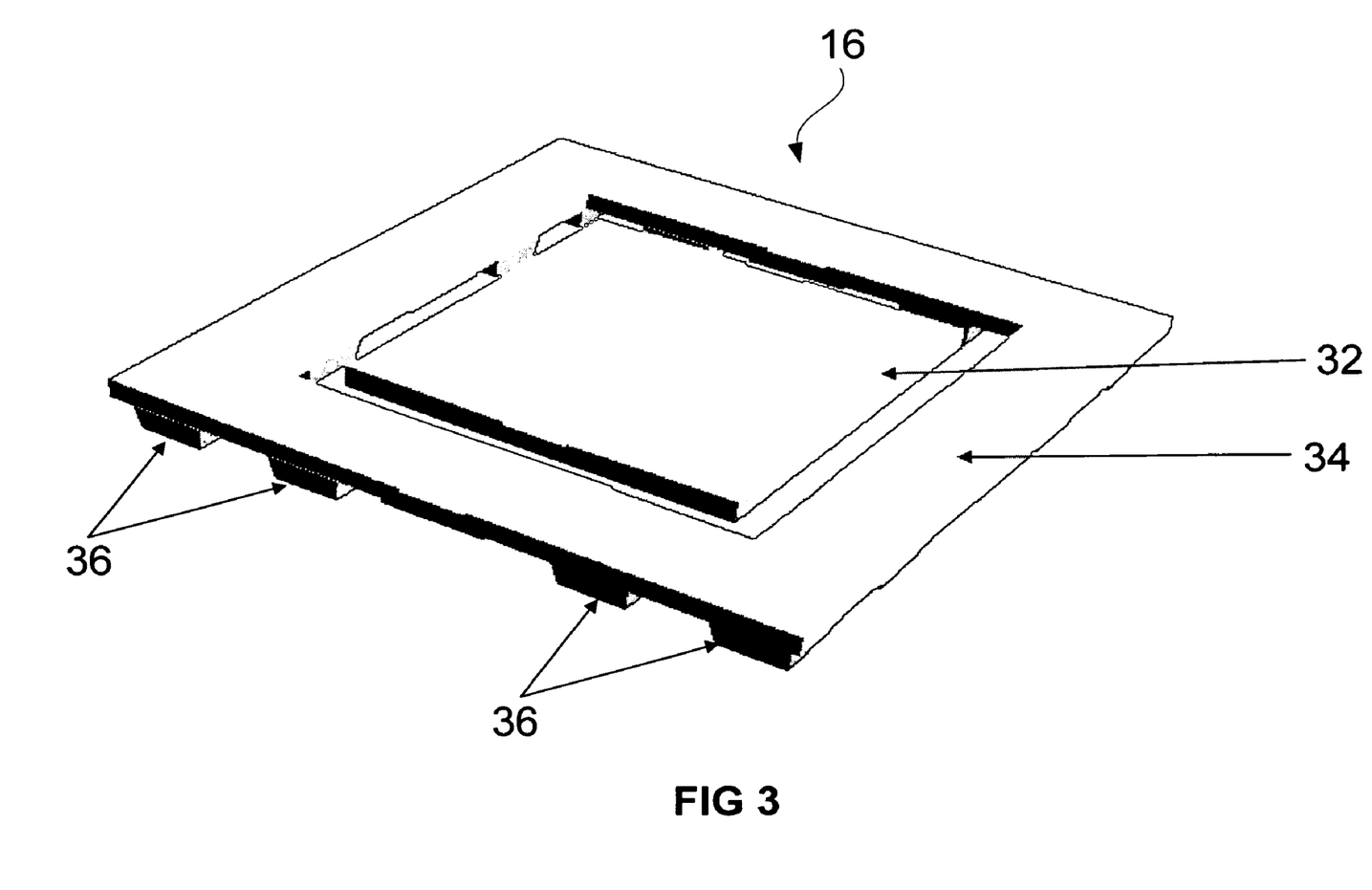
FIG. 3 shows a second layer of a cage according to one embodiment of the present invention.

Referring to FIG. 3, in one embodiment, the second layer 16 of the metrology structure 10 comprises a second portion 32 of the member and is connected to the third portion 22 of the member of the third layer 18 by the post 23. The second layer 16 further comprises a second portion 34 of the cage 13 that supports the third portion 24 of the cage 13 of the layer 18. The second portion 34 of the cage 13 comprises posts 36 that are used to provide structural height therefore and are formed as mentioned above for the layer 18. According to one embodiment, the second portion 34 of the cage 13 comprises twelve posts 36. The number and height of the posts may vary.

Figure 4:
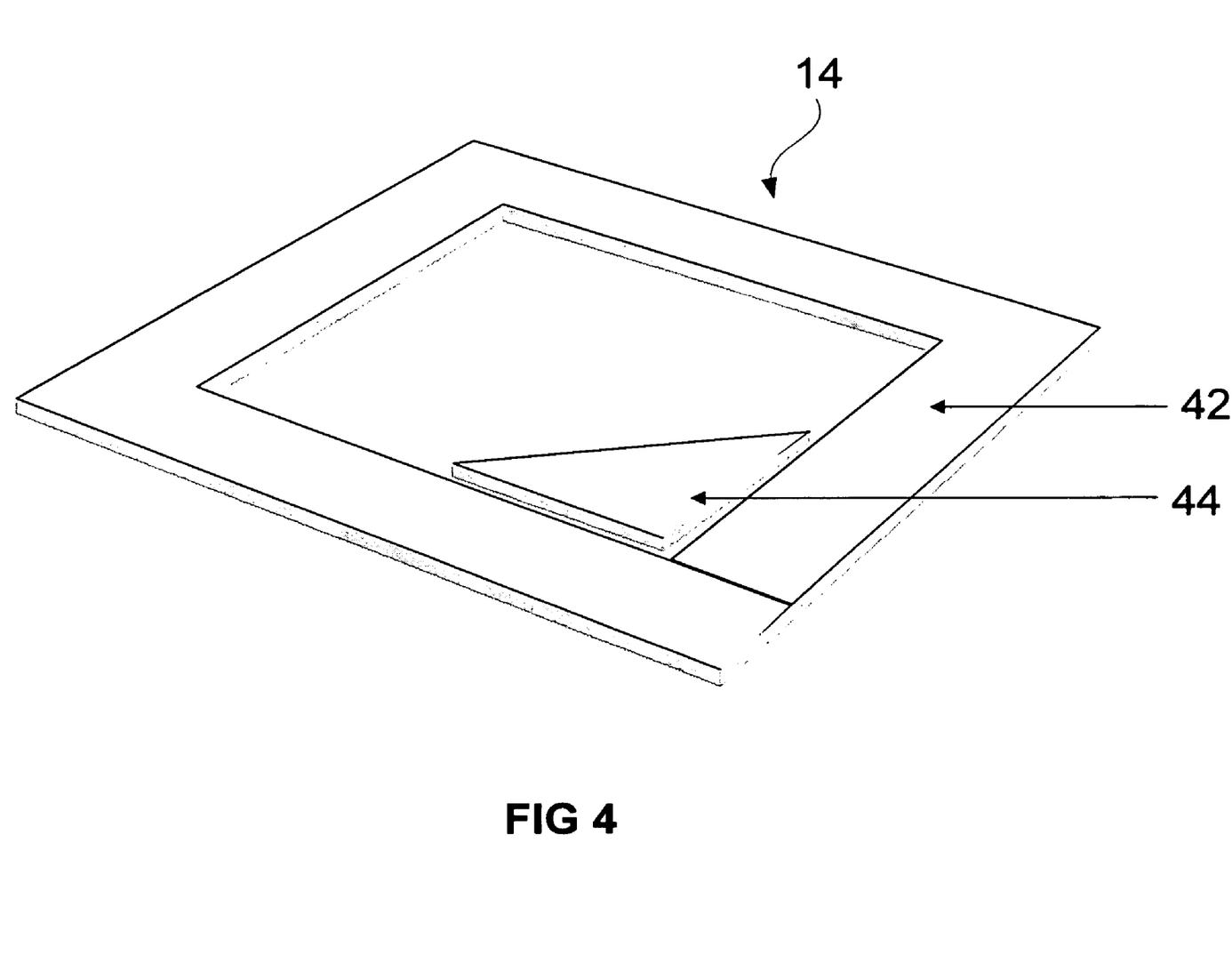
FIG. 4 shows a first layer of a cage according to one embodiment of the present invention.

Referring to FIG. 4, in one embodiment, the first layer 14 of the metrology structure 10 comprises a first portion 42 of the cage 13 that supports the second portion 34 of the cage 13, and a member 44. In one embodiment, the first layer 14 is designed such that the member 44 is disposed on only a portion of the substrate 12. According to one embodiment, the member 44 is disposed in one corner of portion 42 of the cage 13 on the substrate 12. However, the layer 14 can be also be designed such that the member 44 can be disposed on other portions of the substrate 12. The purpose of the member 44, in some embodiments, is to tilt the member 22, 32 at an angle when the member 22, 32, tips or falls on to the substrate 12. Thus the tilted member 22, 32 (FIG. 6) can be more readily discernable to an observer as freed than if the member was disposed flat on the substrate 12.

Figure 5:
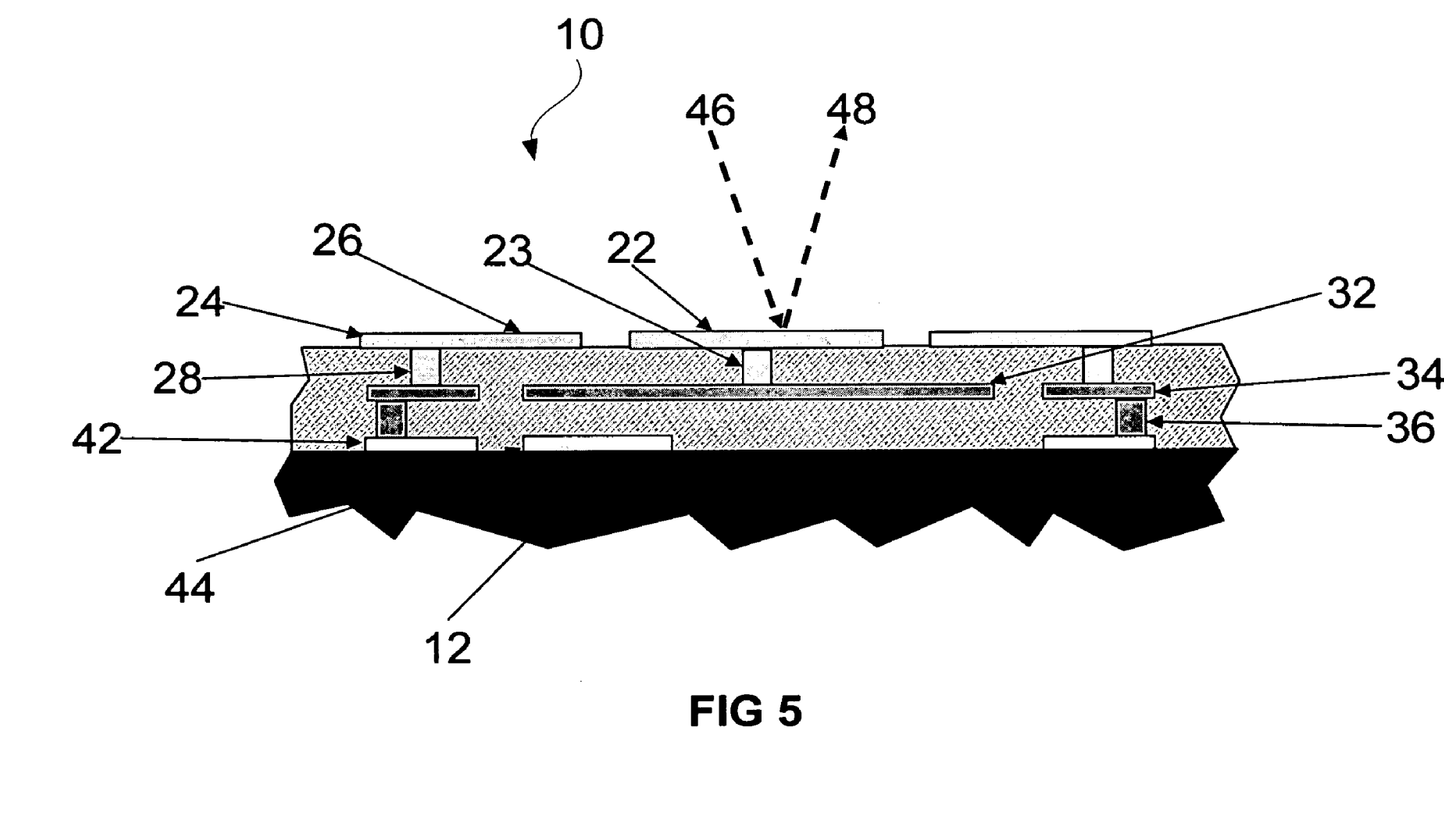
FIG. 5 is a cross-section of a metrology structure before removal of a sacrificial material according to one embodiment of the present invention.
Figure 6:
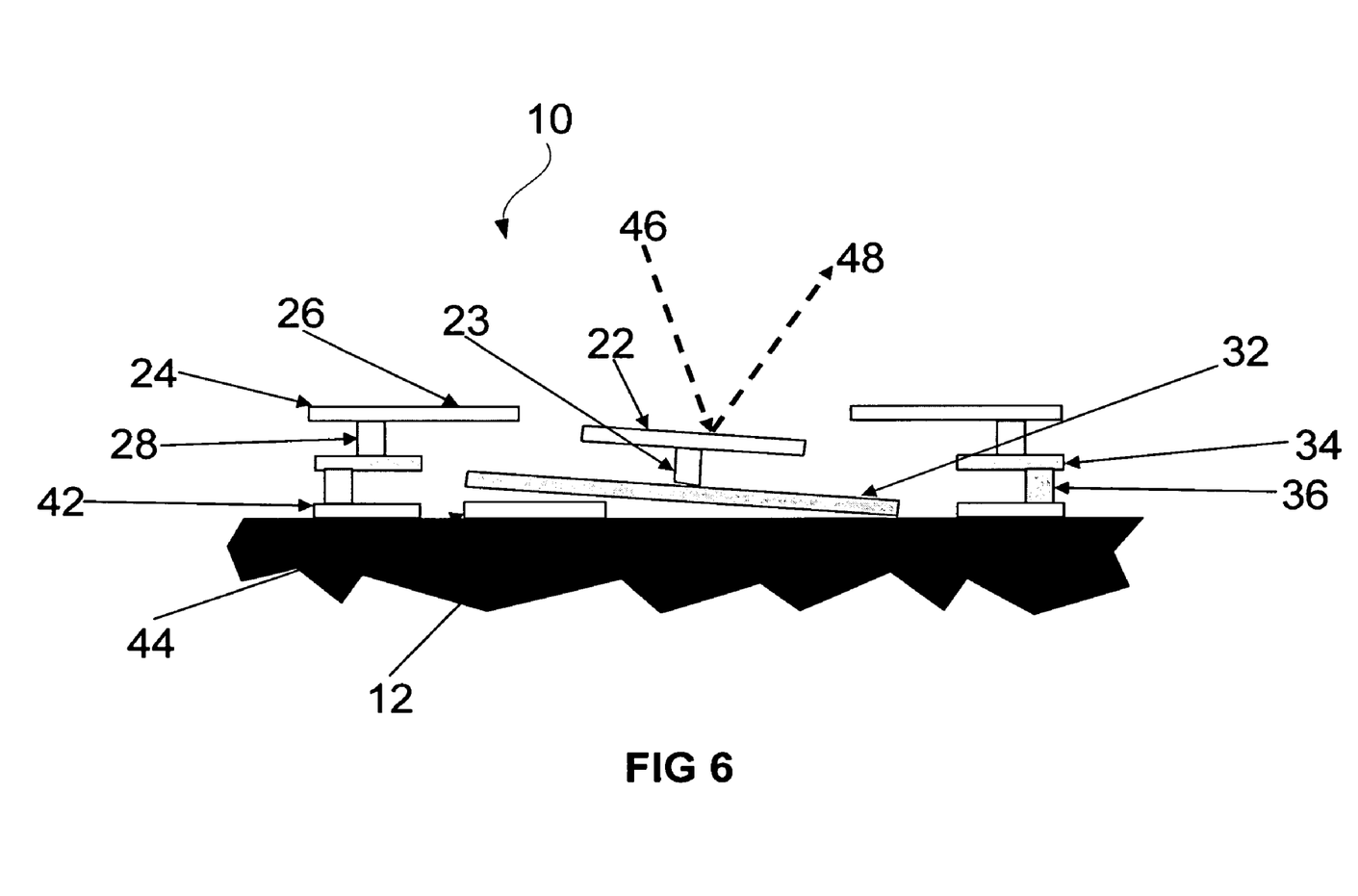
FIG. 6 is a cross-section of a metrology structure after removal of a sacrificial material according to one embodiment of the present invention.

FIG. 5 shows a cross-section of the metrology structure 10, before removal of a sacrificial material according to one embodiment of the invention. The sacrificial material is shown by the hatched area. FIG. 6 shows a cross-section of the metrology structure 10, after removal of a portion of the sacrificial material according to one embodiment of the invention. Arrows 46 and 48 in FIGS. 5 and 6 represent incident and reflected light, respectively on the top surface of the third portion 22 of the member to be freed of the third layer 18 of the metrology structure 10. Referring to FIGS. 2, 3, 4, 5, and 6, as the third portion 22 is freed from the sacrificial material underneath the layer 18 and the second portion 32 is freed from the sacrificial material underneath and surrounding the layer 16, simultaneously, the freed member will be retained in the cage comprising the third portion 24, the second portion 34 and the first portion 42, but will be able to move and drop down within the cage. It should be noted that the posts 28 of the layer 18 and the posts 36 of the layer 16 not only provide support for the layers 18 and 16, respectively, they also prevent the freed member 22, 32 from moving far in a horizontal direction. Also, during the sacrificial material removal process, when external forces try to pull the freed member 22, 32 to float up, the tabs 26 of the third portion 24 of the cage 13 block the second portion 32 of the freed member which, in turn, is connected to the third portion 22 of the freed member of the layer 18, and hence the possibility of the freed member 22, 32 being pulled/floated up in a vertical direction and potentially damaging other devices on a wafer is prevented.

FIGS. 1, 2, 3, 4, 5, 6, 7, and 8 are not drawn to scale. They provide schematic illustration of certain example embodiments.

In one embodiment of the invention, the cage 13 and members 22, 32, and 44 can be made of aluminum or an alloy of aluminum such as aluminum/titanium. However, the above materials are not limiting on the invention, and any other combination of metals, dielectrics, or polymeric materials can also be used. The sacrificial material used can be an organic polymer such as photoresist, or any other suitable material such as silicon, or silicon dioxide, for example. The cage 13 and members 22, 32 may comprise, in one embodiment, a model structure of a real MEMS device(s).

Figure 7:
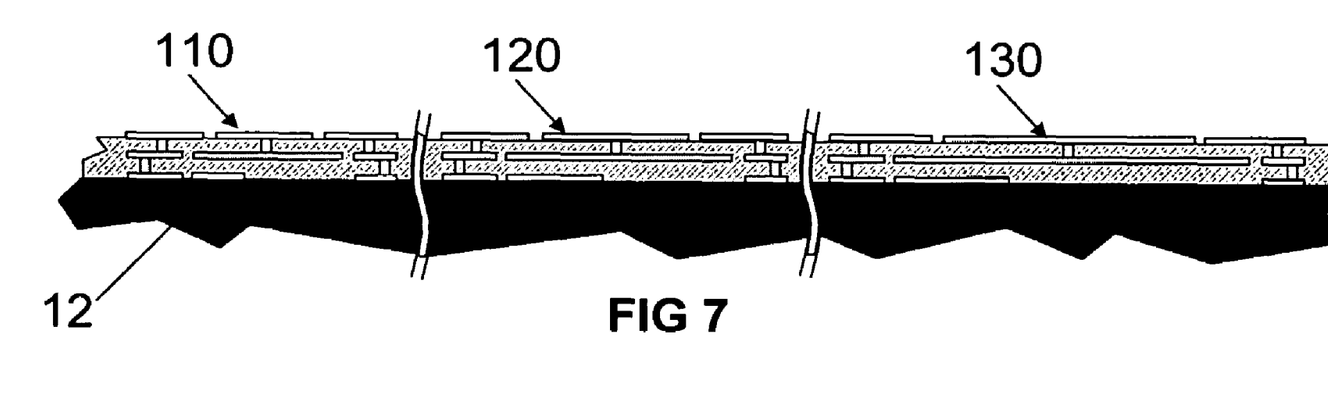
FIG. 7 is a cross-section of a plurality of cages and members disposed on a substrate before removal of a sacrificial material according to another embodiment of the present invention.
Figure 8:
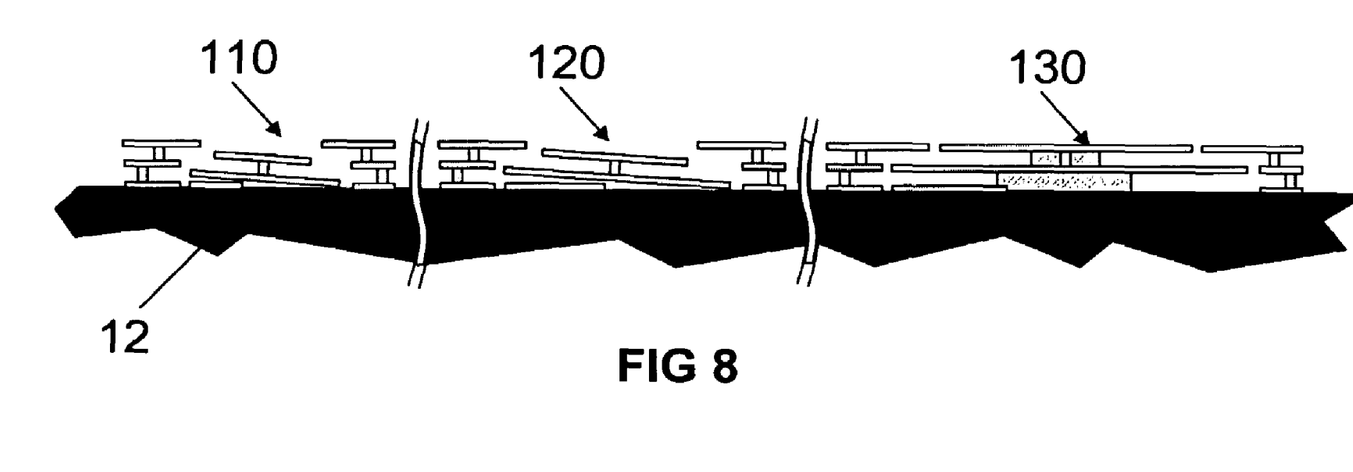
FIG. 8 is a cross-section of a plurality of cages and members disposed on a substrate during removal of a sacrificial material according to another embodiment of the present invention.

According to another embodiment of the invention, a plurality of cages and members of different sizes in area laterally surrounded by a sacrificial material may be disposed on the substrate 12 as shown in FIGS. 7 and 8. For the purposes of illustration, FIGS. 7 and 8 comprise only three cages and members. The number of cages and members may vary. FIG. 7 shows a cross-section of the cages and members before removal of a sacrificial material and FIG. 8 shows a cross-section of the cages and members during removal of a sacrificial material. The sacrificial material is shown by the hatched area in FIGS. 7 and 8. During the sacrificial material removal process, a smallest area member may be freed first. As the removal process progresses in time, successively larger area members will become free. This is because it takes longer time for an etching material to go underneath the larger area member as compared to the smaller area member during the removal process. Referring to FIG. 8, during the sacrificial material removal process, the members 110 and 120 have been freed whereas the member 130 still has some sacrificial material left. By using a plurality of cages and members of increasing size in area, the progress of the removal process can be determined. It should be noted that the increase in size is done laterally as shown in FIGS. 7 and 8 in order to comply with the fabrication techniques. In one embodiment the size of the cages and the members may comprise a range of 1 µm to 500 µm. In an alternate embodiment, the size of the cages and the members may comprise a range of 10 nm to 1000 nm.

According to one embodiment, an observer can determine the state of the removal process, by detecting a change in the characteristic of the freed member 22, 32 such as detecting a change in light reflection (shown by the arrow 48 in the FIG. 6) from a top surface of the first portion 22 of the freed member as compared to the light reflection shown by the arrow 48 in FIG. 5. In an alternate embodiment, the state of the removal process may be determined by detecting a change in the characteristic of the freed member 22, 32 by detecting a change in reflection or scattering of electrons, ions, atoms, or photons.

The metrology structure 10 can be built using standard micro-electronic fabrication techniques such as photolithography, vapor deposition and etching. However, the above techniques are not limiting on the invention and any other suitable techniques can also be used.

It should be noted that the metrology structure 10 provides an easier evaluation to determine the state of removal processes when using manual or automated visual inspection. The metrology structure 10 can be easily scaled or otherwise modified to be useful for monitoring the removal processes for a wide variety of MEMS designs. The metrology structure can be used for various standard mask levels and fabrication steps typically used in fabricating the real MEMS devices, and hence, pursuant to some embodiments, no additional process steps are required to create the metrology structure.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A metrology structure, comprising;

a substrate;

a metrology cage on the substrate, the metrology cage having sacrificial material disposed therein; and a metrology member disposed in the metrology cage and laterally surrounded by the sacrificial material;

wherein the sacrificial material is patterned with holes.

2. The structure as defined in claim 1, wherein the metrology cage and the metrology member comprises a model structure of a real MEMS device.

3. The structure as defined in claim 1, wherein the metrology cage comprises a first layer, a second layer, and a third layer disposed successively on the substrate.

4. The structure as defined in claim 3, wherein the third layer comprises a third portion of the metrology member and a third portion of the metrology cage.

5. The structure as defined in claim 4, wherein the first portion of the metrology cage comprises tabs and posts.

6. The structure as defined in claim 3, wherein the second layer comprises a second portion of the metrology member and a second portion of the metrology cage.

7. The structure as defined in claim 6, wherein the second portion of the metrology cage comprises posts.

8. The structure as defined in claim 6, wherein the second portion of the metrology member is connected to the third portion of the metrology member of the third layer by a post disposed in the third portion of the metrology member of the third layer.

9. The structure as defined in claim 3, wherein the first layer disposed on the substrate comprises a structure disposed on one of a portion of the substrate and a first portion of the metrology cage.

10. A metrology structure, comprising:
a substrate;
a metrology cage on the substrate, the metrology cage having sacrificial material disposed therein;
a metrology member disposed in the metrology cage and laterally surrounded by the sacrificial material; and
a tilting structure disposed below the metrology member and within the metrology cage such that the tilting structure is positioned below only part of the metrology member so that freeing the metrology member from the sacrificial material causes the metrology member to tilt;
wherein the sacrificial material is patterned with holes.

11. The structure as defined in claim 10, wherein the tilting structure causes a freed metrology member to lie at an angle on the substrate.

12. A MEMS device disposed on the substrate as defined in claim 1, the substrate further comprising an array of said metrology structures of different sizes in area disposed thereon.

13. The structure as defined in claim 1, wherein the metrology cage and the metrology member are made from aluminum or an alloy of aluminum.

14. The structure as defined in claim 1, wherein the sacrificial material comprises photoresist, silicon, or silicon dioxide.

15. A metrology structure, comprising:
a substrate;
a plurality of metrology cages of different sizes in area on the substrate, the metrology cages having sacrificial material disposed therein; and
a plurality of metrology members of different sizes disposed in the metrology cages and laterally surrounded by the sacrificial material;
wherein the sacrificial material is patterned with holes.

16. The structure as defined in claim 15, wherein the size of the metrology cages and the metrology members comprise a range of 1 μm to 500 μm.

17. The structure as defined in claim 15, wherein the size of the metrology cages and the metrology members comprise a range of 10 nm to 1000 nm.

18. The structure as defined in claim 1, in which the metrology cage covers an area of 1% of the substrate and a MEMS device covers 99% of the substrate.

19. The structure as defined in claim 10, in which the metrology cage covers an area of 1% of the substrate and a MEMS device covers 99% of the substrate.

20. The structure as defined in claim 15, in which a metrology cage covers an area of 1% of the substrate and a MEMS device covers 99% of the substrate.

* * * * *

UNITED STATES PATENT AND TRADEMARK OFFICE
CERTIFICATE OF CORRECTION

PATENT NO.         : 7,365,405 B2  
APPLICATION NO. : 10/832367  
DATED               : April 29, 2008  
INVENTOR(S)      : Stephen J. Potochnik et al.

Page 1 of 1

It is certified that error appears in the above-identified patent and that said Letters Patent is hereby corrected as shown below:

On the title page, in item (57), under "Abstract", in column 2, line 2, after "comprising" delete ";" and insert -- : --, therefor.

In column 4, line 39, in Claim 1, after "comprising" delete ";" and insert -- : --, therefor.

In column 5, line 5, in Claim 10, after "comprising" delete ";" and insert -- : --, therefor.

In column 6, line 1, in Claim 15, after "comprising" delete ";" and insert -- : --, therefor.

Signed and Sealed this

Eleventh Day of November, 2008

JON W. DUDAS  
*Director of the United States Patent and Trademark Office*